(12) United States Patent
Suzuki et al.

(10) Patent No.: US 8,879,259 B2
(45) Date of Patent: Nov. 4, 2014

(54) COOLING SYSTEM FOR ONBOARD ELECTRICAL POWER CONVERTER, AND ELECTRICAL POWER CONVERTER FOR RAILWAY VEHICLE

(75) Inventors: Osamu Suzuki, Kasumigaura (JP); Yosuke Yasuda, Hitachinaka (JP); Keisuke Horiuchi, Hitachinaka (JP); Tomoo Hayashi, Kudamatsu (JP); Atsuo Nishihara, Kashiwa (JP); Sunao Funakoshi, Kasumigaura (JP)

(73) Assignee: Hitachi, Ltd., Tokyo (JP)

( * ) Notice: Subject to any disclaimer, the term of this patent is extended or adjusted under 35 U.S.C. 154(b) by 497 days.

(21) Appl. No.: 13/213,181

(22) Filed: Aug. 19, 2011

(65) Prior Publication Data
US 2012/0050993 A1    Mar. 1, 2012

(30) Foreign Application Priority Data

Aug. 31, 2010   (JP) ................................. 2010-194030

(51) Int. Cl.
| H05K 7/20 | (2006.01) |
| F28D 15/02 | (2006.01) |
| F28F 1/34 | (2006.01) |
| B61C 5/02 | (2006.01) |
| H01L 23/427 | (2006.01) |
| F28F 7/00 | (2006.01) |

(52) U.S. Cl.
CPC ........ H05K 7/20936 (2013.01); F28D 15/0266 (2013.01); F28F 1/34 (2013.01); H05K 7/20927 (2013.01); B61C 5/02 (2013.01); H01L 23/427 (2013.01)
USPC ........... 361/700; 361/701; 361/703; 363/141; 165/80.4; 165/80.5; 165/104.33; 257/715

(58) Field of Classification Search
CPC ... H05K 7/20936; H05K 7/20927; F28F 1/34; F28D 15/0266; B61C 5/02; H01L 23/427
USPC .............. 361/698–701, 703, 679.52–679.53; 363/141; 165/80.4–80.5, 104.33; 257/714–715, 721–722, E23.088; 174/15.1, 15.2, 548
See application file for complete search history.

(56) References Cited

U.S. PATENT DOCUMENTS

| 3,818,983 A | 6/1974 | Grandia |
| 4,027,728 A | 6/1977 | Kobayashi et al. |

(Continued)

FOREIGN PATENT DOCUMENTS

| EP | 0 577 099 A2 | 1/1994 |
| EP | 0 794 098 A1 | 9/1997 |

(Continued)

OTHER PUBLICATIONS

Japanese Office Action with English Translation dated Jan. 29, 2013 (six (6) pages).

(Continued)

Primary Examiner — Zachary M Pape
(74) Attorney, Agent, or Firm — Crowell & Moring LLP (57) ABSTRACT

A cooling system for an onboard electrical power converter in which a heat dissipation surface extends parallel to a flow of cooling air draft includes: a coolant tank containing coolant that includes a bottom surface being in thermal contact with the heat dissipation surface; a first conduit provided connecting to an upper surface of the coolant tank, the coolant flowing into the first conduit; a heat exchanger that comprises second conduits arranged with opposing the upper surface, and conducts the coolant to upstream; and a return unit that returns the coolant to the coolant tank; wherein the heat exchanger comprises heat dissipation fins through which the cooling air draft passes from a first to a second side, the heat dissipation fins being provided on surfaces of the second conduits, the first side not facing the coolant tank and the second side facing the coolant tank.

2 Claims, 10 Drawing Sheets

(56) References Cited

U.S. PATENT DOCUMENTS

| | | | |
|---|---|---|---|
| 4,694,323 A * | 9/1987 | Itahana et al. | 257/715 |
| 5,198,889 A * | 3/1993 | Hisano et al. | 257/678 |
| 6,504,718 B2 * | 1/2003 | Wu | 361/695 |
| 7,004,239 B2 * | 2/2006 | Osakabe et al. | 165/104.21 |
| 7,957,145 B2 * | 6/2011 | Suzuki et al. | 361/701 |
| 8,174,833 B2 * | 5/2012 | Kitanaka et al. | 361/710 |
| 2008/0298017 A1 * | 12/2008 | Blish, II | 361/699 |
| 2010/0000715 A1 * | 1/2010 | Zheng et al. | 165/80.3 |

FOREIGN PATENT DOCUMENTS

| | | | | |
|---|---|---|---|---|
| JP | 6-21289 A | | 1/1994 | |
| JP | 11-168162 A | | 6/1999 | |
| JP | 11251499 A | * | 9/1999 | H01L 23/427 |
| JP | 2000-92819 A | | 3/2000 | |
| JP | 2003274671 A | * | 9/2003 | H02M 7/48 |
| JP | 3513846 B2 | | 1/2004 | |
| JP | 3646474 B2 | | 2/2005 | |
| JP | 2006-149199 A | | 6/2006 | |
| JP | 2009-275945 A | | 11/2009 | |

OTHER PUBLICATIONS

Partial European Search Report Dated Jun. 28, 2013 {Six (6) Pages}.

* cited by examiner

COOLING SYSTEM FOR ONBOARD ELECTRICAL POWER CONVERTER, AND ELECTRICAL POWER CONVERTER FOR RAILWAY VEHICLE

INCORPORATION BY REFERENCE

The disclosure of the following priority application is herein incorporated by reference:

Japanese Patent Application No. 2010-194030, filed Aug. 31, 2010.

BACKGROUND OF THE INVENTION

1. Field of the Invention

The present invention relates to a cooling system for an onboard electrical power converter that is mounted to an electric automobile, a hybrid automobile, or a railway vehicle or the like, and to an electrical power converter for a railway vehicle.

2. Description of Related Art

With an electric automobile, a hybrid automobile, or a railway vehicle, a motor is provided in order to serve as a source of motive power, and an electrical power converter such as an inverter or the like is provided in order to control the electrical power supplied to this motor. Such an electrical power converter typically includes a power module that includes power semiconductors such as IGBTs (Insulated Gate Bipolar Transistor) or the like, a drive circuit for driving that power module, a control circuit for controlling it, and one or more capacitors for current smoothing.

It is necessary to cool the electronic components used in this circuitry, since they are vulnerable to high temperatures. Systems provided with electrical power converter that generate great amounts of heat, and that are provided with cooling systems employing the method commonly termed "two-phase thermosyphon cooling system", are disclosed in the specifications of Japanese Patent No. 3,646,474 and Japanese Patent No. 3,513,846. With the two-phase thermosyphon cooling system, a cooling chamber or a sealed system that is built to circulate a coolant liquid and so provide liquid cooling is charged with coolant whose physical state is in liquid-vapor two phase, that is, the physical state can change between the vapor phase and the liquid phase.

SUMMARY OF THE INVENTION

However since, with the cooling system described in Japanese Patent No. 3,646,474, it is arranged for a draft of cooling air to be blown against a heat exchanger provided above the subject to be cooled by an air blower that is provided further above the heat exchanger, accordingly the dimension in the height direction of the entire system including the air blower becomes large. As a result, it has been difficult to provide a structure in which this system can conveniently be housed within the front machinery compartment of an electric automobile. Moreover because, while the direction of flow of the air entering into the heat exchanger is approximately perpendicular to the upper surface of the evaporation chamber, by contrast, the air that exits is directed to flow approximately parallel to the upper surface of the evaporation chamber, accordingly there is also the problem that the amount of draft is restricted due to the fact that the air flow is turned through approximately a right angle and this creates undesirably high resistance to its flow, so that cooling performance is reduced.

Furthermore, while a cooling system for an onboard electrical power converter is described in Japanese Patent No. 3,513,846, in this prior art, it is arranged for a cooling air draft that flows from the front of the vehicle towards its rear to be conducted to the coolant heat exchanger. However, since the container for dissipation of heat from the coolant is provided approximately vertically with respect to the electrical power converter, accordingly there is the shortcoming that the dimension of the front machinery compartment in the height direction can easily become great.

According to the 1st aspect of the present invention, a cooling system for an onboard electrical power converter in which a heat dissipation surface extends substantially parallel to a flow of cooling air draft, comprises: a coolant tank that contains coolant, and includes a bottom surface and an upper surface, the bottom surface being in thermal contact with the heat dissipation surface of the onboard electrical power converter; a first conduit that is provided connecting to the upper surface of the coolant tank and at downstream of the flow of the cooling air draft, the coolant flowing from the coolant tank out into the first conduit; a heat exchanger that comprises a plurality of second conduits arranged with opposing the upper surface of the coolant tank so as to extend along the upper surface from downstream of the flow of the cooling air draft to upstream thereof, and that conducts the coolant in the first conduit to upstream of the flow of the cooling air draft via the plurality of second conduits; and a return unit that returns the coolant from the heat exchanger to the coolant tank; wherein the heat exchanger comprises a plurality of heat dissipation fins through which the cooling air draft passes from a first side of the heat exchanger to a second side of the heat exchanger, the heat dissipation fins being provided on outer surfaces of the second conduits, the first side not facing the coolant tank and the second side facing the coolant tank.

According to the 2nd aspect of the present invention, it is preferred that in a cooling system for an onboard electrical power converter according to the 1st aspect, the cooling system is one that employs an evaporative cooling method in which the coolant within the coolant tank is boiled and evaporated by heat from the electrical power converter; the return unit is configured to a third conduit that is shorter than the first conduit; the third conduit is provided to the upper surface of the coolant tank at the upstream of the flow of the cooling air draft, and returns the coolant in the plurality of second conduits to the coolant tank; and the inclination of the plurality of the heat dissipation fins is set to be approximately parallel to the flow of the cooling air draft.

According to the 3rd aspect of the present invention, an electrical power converter for a railway vehicle, comprises: an air blower device that blows a cooling air draft, provided underneath a floor of the railway vehicle; a cooling unit, comprising two cooling systems according to claim 2 disposed along the flow of the cooling air draft; a converter unit that is cooled by one of the cooling systems of the cooling unit, and that converts supplied AC power into DC power; and an inverter unit that is cooled by the other of the cooling systems of the cooling unit, and that converts the DC power outputted from the converter unit into AC power that is then supplied to a traction motor; wherein the heat exchangers of the two cooling systems are arranged so as to be mutually staggered apart in the direction perpendicular to the flow of the cooling air draft, so that the cooling air draft that has passed through the heat exchanger of the cooling system that is disposed at the upstream side of the cooling unit does not flow into the heat exchanger of the cooling system that is disposed at the downstream side of the cooling unit.

According to the 4th aspect of the present invention, an electrical power converter for a railway vehicle, comprises: an electrical power conversion unit that is provided underneath a floor of the railway vehicle, and that, after having temporarily converted supplied AC power into DC power, re-converts this DC power back into AC power that is then supplied to a traction motor; a cooling system according to the 2nd aspect, attached to a heat dissipation surface of the electrical power conversion unit; and an air blower device that blows the cooling air draft against the heat exchanger of the cooling system.

According to the 5th aspect of the present invention, it is preferred that in a cooling system for an onboard electrical power converter according to the 2nd aspect, the onboard electrical power converter is provided underneath a floor of a railway vehicle, so that a heat dissipation surface thereof is substantially vertical; and the third conduit is arranged to be lower in the vertical direction than the first conduit.

According to the 6th aspect of the present invention, it is preferred that in a cooling system for an onboard electrical power converter according to theist aspect, the return unit for returning the coolant in the heat exchanger to the coolant tank comprises a circulation pump that circulates the coolant between the coolant tank and the heat exchanger.

With such a cooling system according to the present invention that cools an electrical power converter for onboard use, it is possible to anticipate enhancement both of the compactness and the performance.

BRIEF DESCRIPTION OF THE DRAWINGS

FIG. 6A shows the case in which they flow in the same direction, and FIG. 6B shows the case in which they flow in opposite directions;

DESCRIPTION OF THE PREFERRED EMBODIMENTS

In the following, embodiments for implementation of the present invention will be explained with reference to the drawings.

Embodiment #1

Figure 1:
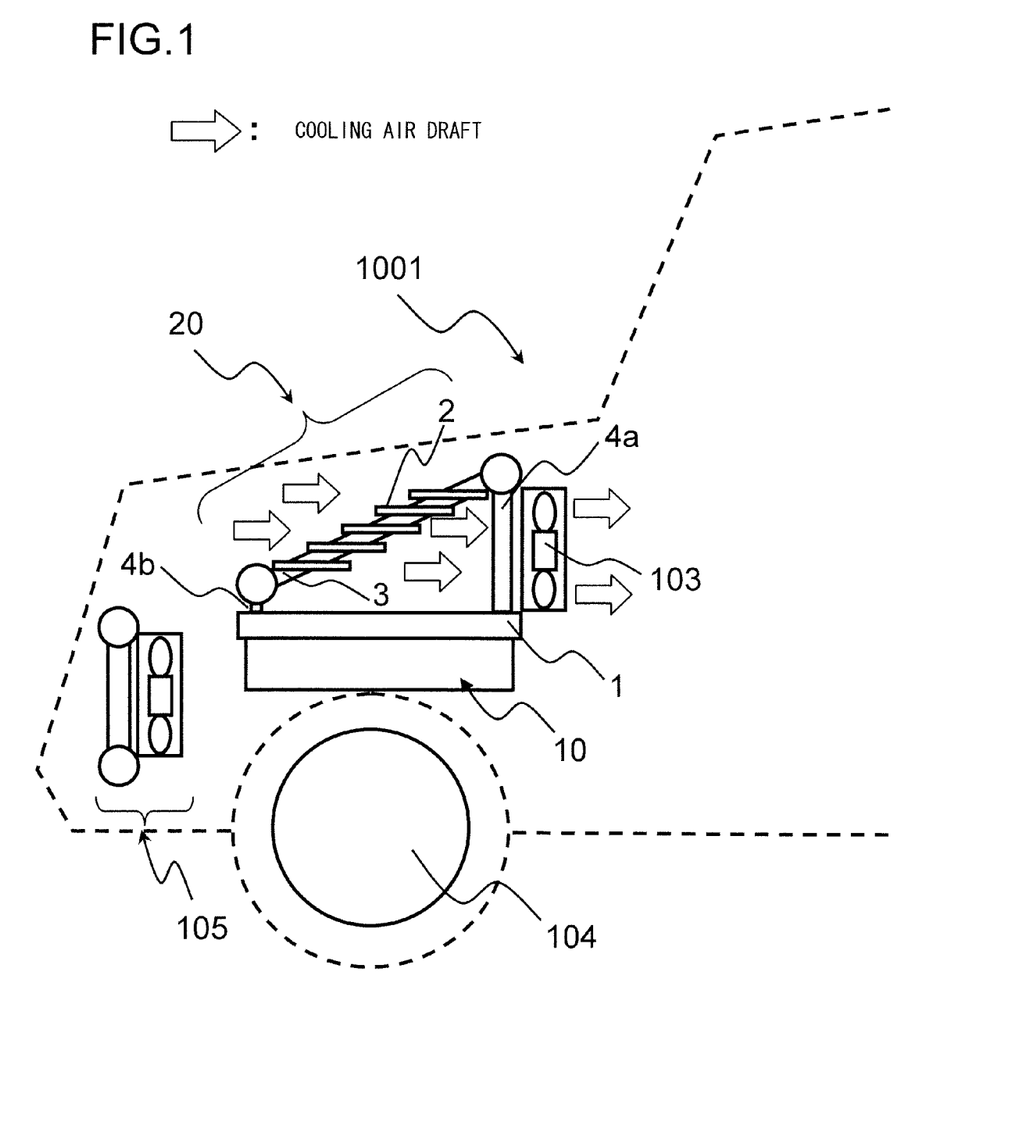
FIG. 1 is a figure showing a first embodiment of the cooling system for an onboard electrical power converter according to the present invention.

FIG. 1 is a figure showing a first embodiment of the cooling system for an onboard power converter according to the present invention, and shows a case in which this cooling system is applied to an electric automobile. This figure shows the front part of a front machinery compartment portion of an electric automobile that includes an electrical power converter to which the cooling system of this embodiment is provided, as seen from the side. An electrical power converter 10 for driving a motor 104 that propels this electric automobile 1001 is provided in the interior of this front machinery compartment. As will be described hereinafter, electronic components that make up an inverter circuit and so on are provided in this electrical power converter 10. A cooling system 20 is provided to the electrical power converter 10 for cooling the electrical power converter 10. And an air blower 103 for supplying a draft of cooling air to the cooling system 20 is provided to the rearward of the vehicle from the cooling system 20. It should be understood that while, in this embodiment, the cooling air draft is generated by the air blower 103, it would also be acceptable to employ, as the cooling air draft, simply the relative wind taken in from the front of the vehicle as it travels. From the viewpoint of lightening the structure by shortening the wiring, and also of enhancing the anti-noise characteristics, the electrical power converter 10 is disposed in a position close to the motor 104 that propels the vehicle, for example approximately above the propelling motor 104.

The reference symbol 105 denotes a heat exchanger of an air conditioner that directs conditioned air into the passenger compartment. Although this feature is not shown in the figures, a cooling system for cooling the vehicle traction motor 104 is also housed within the front machinery compartment, since a large quantity of heat is generated by the traction motor 104. On the one hand, in this manner, a large number of components for which cooling or heat exchange by intake of surrounding external air is necessary are provided in the interior of the front machinery compartment of this electric automobile, but, since the surrounding external air is limited to being taken in from the front surface of the vehicle, accordingly it becomes very important to guarantee as great an amount of cooling air draft as possible, while still making the cooling system more compact.

Figure 2:
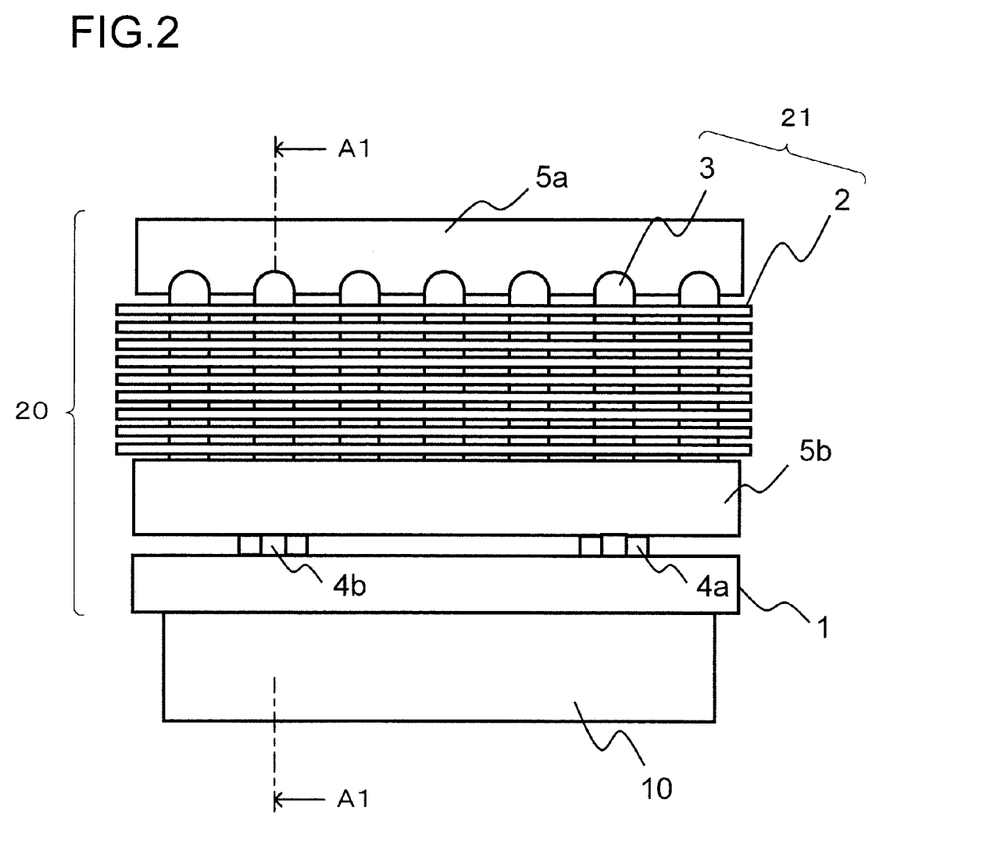
FIG. 2 is a figure showing this cooling system 20 as seen from the front of the vehicle.
Figure 3:
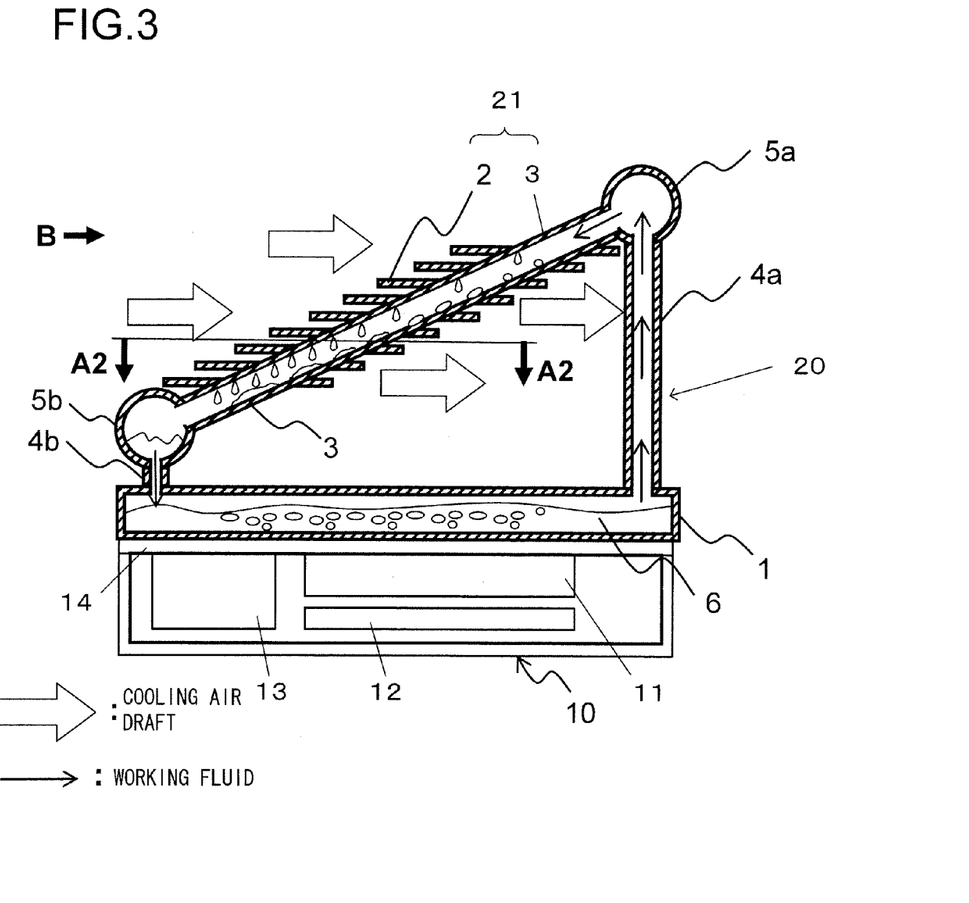
FIG. 3 is a sectional view of FIG. 2 in a plane A1-A1.

FIGS. 2 and 3 are figures showing the cooling system according to this embodiment of the present invention. FIG. 2 is a figure showing this cooling system, which is fitted to the electrical power converter, as seen from the front of the vehicle, and FIG. 3 is an A1-A1 sectional view of FIG. 2. The reference symbol 10 denotes the electrical power converter that is the subject of cooling, while 20 denotes the cooling system.

As shown in FIGS. 2 and 3, the cooling system 20 includes an evaporation chamber 1, a pair of vapor pipes 4a and a pair of liquid return pipes 4b that are provided to lead upward from the upper surface of the evaporation chamber 1, a vapor header 5a that is connected to the vapor pipes 4a, a liquid return header 5b that is connected to the liquid return pipes 4b, a plurality of heat transfer conduits 3 that are connected between the vapor header 5a and the liquid return header 5b, and a plurality of heat dissipation fins 2 that are attached to the plurality of heat transfer conduits 3 so as to bridge between them. It should be understood that the internal diameter of the liquid return pipes 4b in which liquid coolant flows is smaller than the internal diameter of the vapor pipes 4a in which coolant vapor flows. In this embodiment, the heat transfer conduits 3 and the heat dissipation fins 2 constitute a heat exchanger 21.

As shown in FIG. 3, the liquid return pipes 4b are set to be shorter than the vapor pipes 4a, so that the liquid return header 5b that is provided more upstream in the cooling air draft is positioned lower than the vapor header 5a that is provided more downstream therein. Due to this construction, the plurality of heat transfer conduits 3 are tilted so as to become lower in the upstream direction. Each of the heat dissipation fins 2 that bridge between the plurality of heat transfer conduits 3 is fitted to them so that its inclination is almost horizontal, in other words, so that its surface extends parallel to the flow of the cooling air draft. In other words, each of the heat dissipation fins 2 is layered. Coolant 6 is enclosed in the interior of this cooling system 20, and some of this coolant 6 inside the cooling system 20 is in its liquid-vapor two phase while some is in its liquid phase. Pure water or a fluorine type coolant or the like may, for example, be used as this coolant 6 for evaporative cooling.

Figure 4:
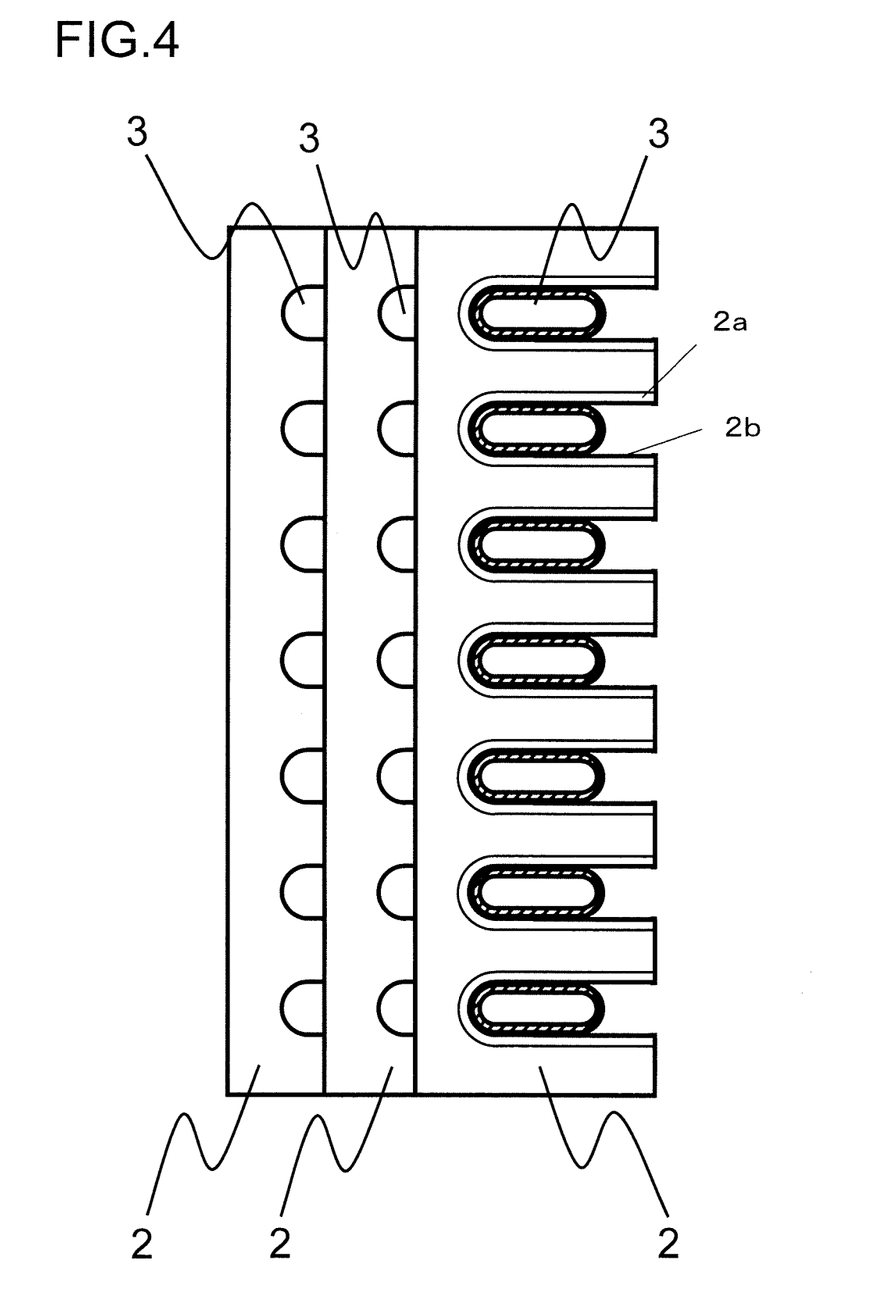
FIG. 4 is a sectional view of FIG. 3 in a plane A2-A2.
Figure 5:
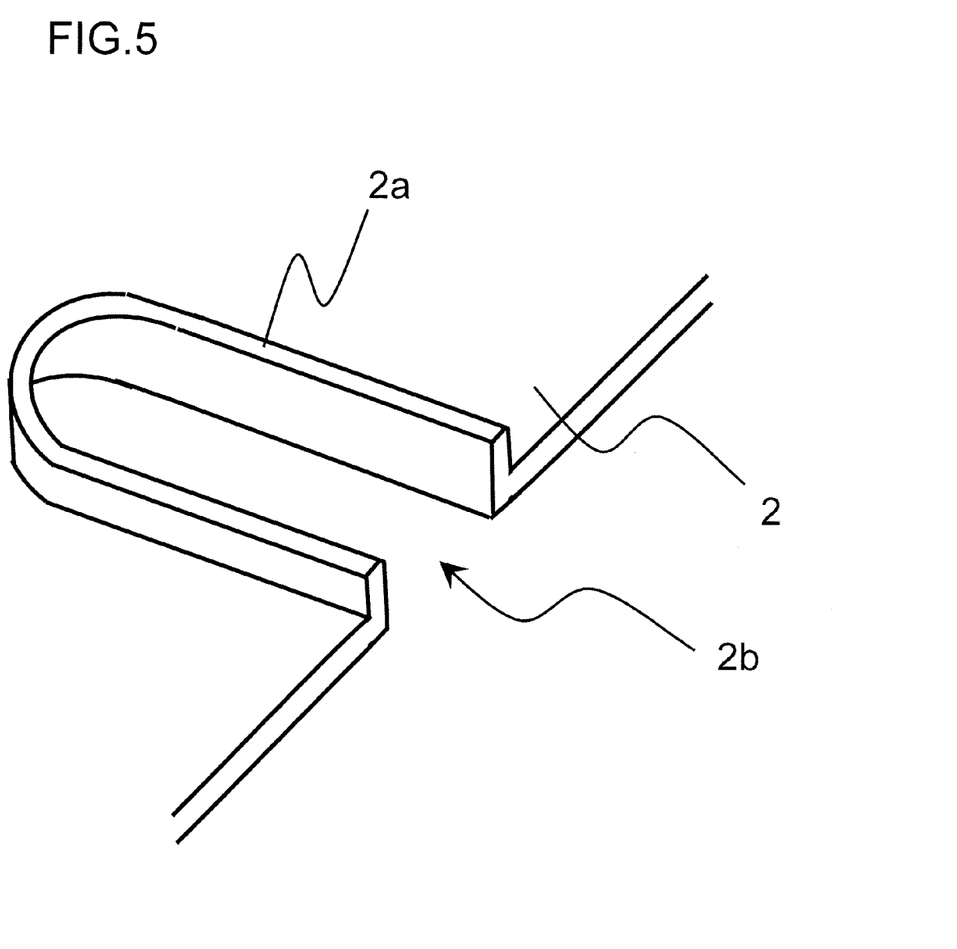
FIG. 5 is a figure showing the shape of a fitting portion of a heat dissipation fin 2.

FIG. 4 is a sectional view of FIG. 3 in a plane A2-A2, and FIG. 5 is a figure showing the shape of a fitting portion of one of the heat dissipation fins 2. While cylindrical tubes are used for the heat transfer conduits 3, the cross section shown in FIG. 4 of the heat transfer conduit 3 is elliptical, because this heat transfer conduit 3 (that is formed as a cylindrical tube) has been sectioned along a plane that is angled at a slant to its central axis. Several cutaways 2b formed generally as slots are cut in each of the heat dissipation fins 2, and these cutaways 2b are adapted so that the heat transfer conduits 3 can be inserted into them, thereby mounting the fins 2 to the conduits 3.

A collar 2a formed as a letter-U shape and thicker than the main body of the heat dissipation fin 2 is provided around each of the cutaways 2b, and a portion of this collar 2a is joined to the corresponding heat transfer conduit 3 by soldering or the like. As a result, the heat dissipation fin 2 and the heat transfer conduit 3 are connected together in a thermally satisfactory manner. Moreover, since the cutaways 2b for insertion of the heat transfer conduits 3 are provided in the heat dissipation fins 2, accordingly, not only are the heat dissipation fins 2 (which have high capacity) held in place so that their angles are uniform, but also it is possible to connect them to the conduits 3 simply and easily in a short period of time.

The electrical power converter 10 converts DC power from a battery (not shown in the figures) mounted to the vehicle into AC power, and this AC power is supplied to the motor for vehicle traction 104. As shown in FIG. 3, a power module 11 that includes power semiconductor elements making up an inverter circuit, a drive control circuit 12 that drive controls this power module 11, and a capacitor module 13 for smoothing are provided to this electrical power converter 10. These electronic components are in thermal contact with a heat dissipation base 14 of the electrical power converter 10, and the heat that they generate is transferred to the evaporation chamber 1 via the heat dissipation base 14. Although this feature is not shown in the figures, it should be understood that a power module for auxiliary machinery, for driving auxiliary machinery such as a motor that drives a compressor for an air conditioner, a motor that drives a hydraulic pump for control, and so on, is also included in the electrical power converter 10.

Referring to FIG. 3, an outline of the cooling operation of this cooling system 20 will now be explained. The cooling system 20 uses the so called evaporative cooling method, in which the coolant 6 that is in the liquid state in the evaporation chamber 1 is evaporated or boiled by the heat evolved by the electrical power converter 10 and goes into the vapor state, so that some of the evolved heat is absorbed by its latent heat. The vapor that is thus generated in the evaporation chamber 1 rises within the vapor pipes 4a and flows into the vapor header 5a. It should be understood that, at a time point when no liquid coolant is accumulated in the liquid return header 5b, a portion of the coolant vapor within the evaporation chamber 1 flows into the liquid return header 5b from the liquid return pipes 4b, but this is an extremely small amount of coolant, as compared to the amount of coolant vapor that flows in the vapor pipes 4a.

The coolant vapor that has flowed into the vapor header 5a flows into each of the plurality of heat transfer conduits 3 that are connected to the vapor header 5a, and flows within these heat transfer conduits 3 towards their other ends (in the direction of the liquid return header 5b). At this time, the flow direction of the coolant that has condensed within the heat transfer conduits 3 is directed towards the liquid return header 5b using the difference of height, since the vapor header 5a is mounted higher than the liquid return header 5b, so that the flow can be limited to being one-way.

As described above, the plurality of heat dissipation fins 2 are attached to the outer surfaces of the heat transfer conduits 3. Due to exchange of heat with the surrounding air (i.e. with the cooling air draft) via these heat dissipation fins 2, the heat received by the coolant vapor from the electrical power converter 10 is dissipated to the cooling air draft. In this embodiment, the electrical power converter 10 and the cooling system 20 are provided within the front machinery compartment of the electric automobile 1001. Due to the operation of the air blower 103 that is provided behind the heat exchanger 21, a cooling air draft is created that flows from the front of the heat exchanger 21 to its rear. Because of this, as shown in FIG. 3, this cooling air draft comes to blow from the side of the liquid return header 5b towards the side of the vapor header 5a. It should be understood that it would also be acceptable to utilize the relative wind when the vehicle is traveling as a draft of cooling air by providing an air intake for this relative wind in front of the cooling system 20, instead of the air blower 103, or in addition thereto.

The coolant vapor condenses and goes into the liquid phase due to heat dissipation by heat exchange with the heat transfer conduits 3, and the resultant liquid coolant flows downward through the sloping heat transfer conduits 3 and is collected in the liquid return header 5b. This liquid coolant that has been collected in the liquid return header 5b then returns via the liquid return pipes 4b to the evaporation chamber 1. Due to this cycle in which coolant evaporates in the evaporation chamber 1 and coolant condenses in the heat transfer conduits 3 being repeated, the heat evolved by the electrical power converter 10 is dissipated to the cooling air draft.

With the cooling system 20 shown in FIG. 3, the evaporation chamber 1 (which is the coolant tank) is arranged to be almost parallel to the flow of the draft of cooling air. And the plurality of heat transfer conduits 3 that constitute a portion of the heat exchanger 21 are positioned so as to face the upper surface of the evaporation chamber 1, and are arranged so as to extend along that upper surface from downstream of the cooling air draft to upstream thereof, so that the coolant vapor flows within the heat transfer conduits 3 in the upstream direction of the cooling air draft. Moreover, due to the heat dissipation fins 2 that are provided on the outer surfaces of the heat transfer conduits 3, the cooling air draft that flows in the opposite direction to that in which the heat transfer conduits 3 extend flows from the upper sides of the heat transfer conduits 3 to the lower sides of the heat transfer conduits 3. In other words, the draft of cooling air passes from the sides of the heat transfer conduits 3 that do not face the evaporation chamber 1 to their sides that do face the evaporation chamber 1.

The heat exchanger 21 that includes the heat dissipation fins 2 and the heat transfer conduits 3 has a structure as described above. Due to this, even though it is arranged for the heat dissipation surface of the onboard electrical power converter 10 to be almost parallel to the flow of the draft of cooling air, it is possible to ensure that the area on the heat exchanger 1 where the cooling air draft flows past it is almost the same as the area of the evaporation chamber 1. Accordingly, along with ensuring the performance of the heat exchanger 21, it is also possible to reduce the dimension in the height direction of this cooling system 20 that includes the heat exchanger 21.

Since in the case of this embodiment the cooling system 20 is of the evaporative cooling type, the heat transfer conduits 3 are tilted so as to become lower towards the upstream of the flow of cooling air, so that the coolant that has condensed is collected in the liquid return header 5b. The heat dissipation fins 2 are provided so as to be angled with respect to the heat transfer conduits 3 that are themselves tilted, so that they are almost parallel to the flow of the cooling air draft. Due to this it becomes possible to increase the amount of cooling air flow, because there is no resistance due to the cooling air draft being bent around where it passes through the heat dissipation fins 2. Moreover, since the heat dissipation fins 2 are angled with respect to the heat transfer conduits 3, accordingly, as shown in FIG. 4, there is also the advantageous aspect that the thermal contact area between the heat dissipation fins 2 and the heat transfer conduits 3 becomes greater. Yet further, with the cooling system 20 shown in FIG. 3, since the coolant vapor flows within the heat transfer conduits 3 from the downstream side with respect to the flow of the cooling air draft to the upstream side, the high temperature coolant and the low temperature coolant (i.e. the cooling air draft) flow in opposite directions, so that it is possible further to enhance the performance for heat exchange.

Figure 6A:
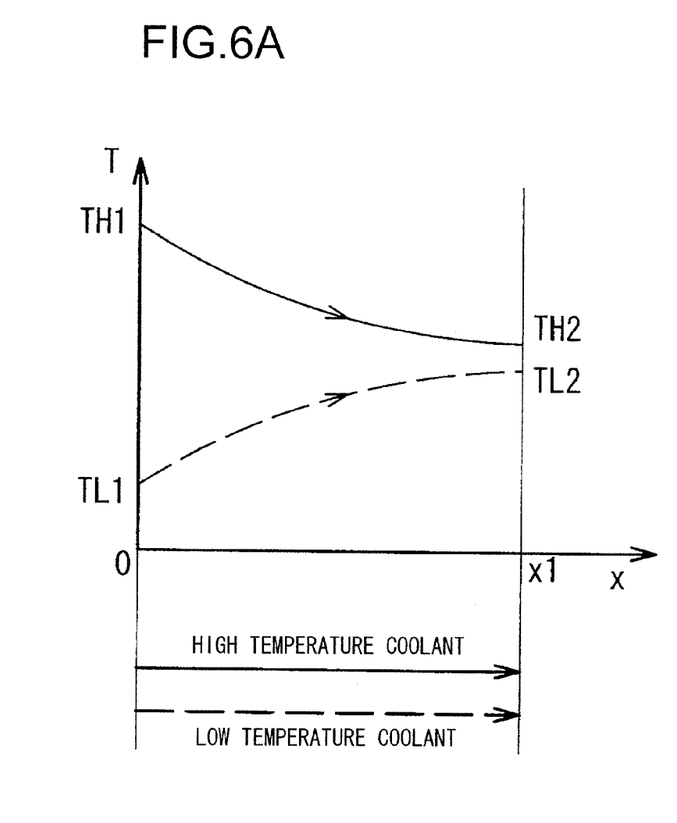
FIGS. 6A and 6B are figures conceptually showing the coolant temperatures when a high temperature coolant and a low temperature coolant flow in opposite directions, and when they flow in the same direction.
Figure 6B:
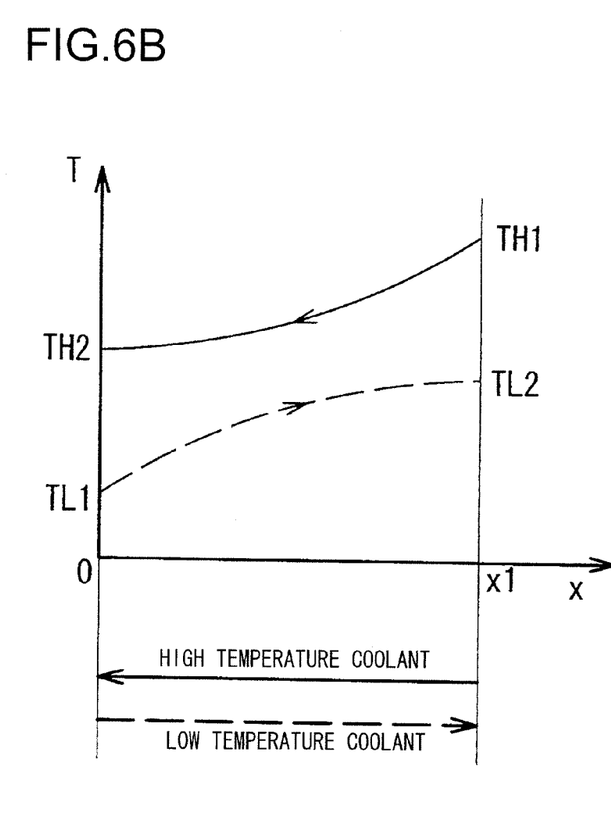

FIGS. 6A and 6B are figures conceptually showing the coolant temperatures when a high temperature coolant and a low temperature coolant flow in opposite directions, and when they flow in the same direction, respectively. FIG. 6A shows the case in which they flow in the same direction, and FIG. 6B shows the case in which they flow in opposite directions. In both cases, temperature is shown along the vertical axis, and the position along the flow direction of the coolant is shown along the horizontal axis. The high temperature coolant corresponds to the coolant vapor that flows within the heat transfer conduits 3, while the low temperature coolant corresponds to the draft of cooling air. The temperature TH1 is the temperature of the high temperature coolant at its inlet, while the temperature TL1 is the temperature of the low temperature coolant at its inlet.

The case shown in FIG. 6A when both coolants are flowing in the same direction corresponds to a hypothetical case in which, in FIG. 3, the coolant vapor were to be flowing in the direction from upstream of the cooling air draft (x=0) to its downstream (x=x1). The temperature difference ΔT1 between the high temperature coolant and the low temperature coolant at the inlet for the high temperature coolant (x=0) is ΔT1=TH1−TL1. The temperature of the high temperature coolant drops due to heat exchange between the high temperature coolant and the low temperature coolant, and conversely the temperature of the low temperature coolant rises. Due to this, the temperature difference ΔT2=TH2−TL2 at the outlet for the high temperature coolant (x=x1) is small as compared to ΔT1 described above.

On the other hand, in the case shown in FIG. 6B when the two flows of coolant are opposite, the temperature at the inlet of the high temperature coolant (x=x1) and the temperature at the inlet of the low temperature coolant (x=0) are respectively equal to the inlet temperature TH1 of the high temperature coolant and the inlet temperature TL1 of the low temperature coolant shown in FIG. 6A. The temperature of the high temperature coolant decreases due to heat exchange with the low temperature coolant, and becomes TH2 at its outlet. And the temperature of the low temperature coolant increases due to heat exchange with the high temperature coolant, and becomes TL2 at its outlet.

The transfer of heat from the high temperature coolant to the low temperature coolant depends upon the temperature difference between them. In the case of flow in the same direction shown in FIG. 6A, while the temperature difference ΔT1 at the high temperature coolant inlet is large, it changes greatly as the coolants approach their outlets, and the temperature difference ΔT2 in the vicinity of the outlets becomes quite small. On the other hand, in the case of flow in opposite directions shown in FIG. 6B, the temperature difference does not change greatly from the inlet of the high temperature coolant towards its outlet. Due to this, if the total amounts of heat exchanged from the inlets to the outlets in the two cases are compared, it will be understood that the total heat amount is greater in the case of opposite flow.

In this embodiment, by arranging the heat transfer conduits 3 so that the flow of coolant vapor is from the upstream side towards the downstream side with respect to the flow of the cooling air draft, it is arranged for the relationship between the direction of the flow of coolant vapor and the direction of the flow of the draft of cooling air to be opposite, as described above. As a result it is possible to enhance the heat dissipation performance of the heat exchanger 21 (i.e. its heat exchange ratio), and it is thereby possible to contemplate enhancement of the performance of the cooling system 20 as a whole.

Embodiment #2

While a cooling system 20 of the evaporative cooling type was explained in the first embodiment described above, the present invention can also be applied even if the evaporative cooling method is not employed. With the cooling system 120 shown in FIG. 7, a method is employed in which a liquid coolant (for example cooling water) is forcibly circulated by a circulation pump 7 and does not change its physical phase. It should be understood that, to structural elements that are the same as ones shown in FIG. 3, the same reference symbols are appended. Heat exchange between the electrical power converter 10 and the coolant is performed by a coolant tank 121. A heat exchanger 21 is provided above the coolant tank 121, with a plurality of heat transfer conduits 3 connecting between a coolant head 5c that is located at the downstream of a flow of cooling air and a coolant head 5d that is provided at the upstream thereof. The coolant heat 5c is connected by a coolant conduit 4 to the upper surface of the coolant tank 121 at a downstream position thereof. On the other hand, the coolant head 5d is connected to an upstream position of the coolant tank 121 via a coolant conduit 4 and a circulation pump 7.

Figure 7:
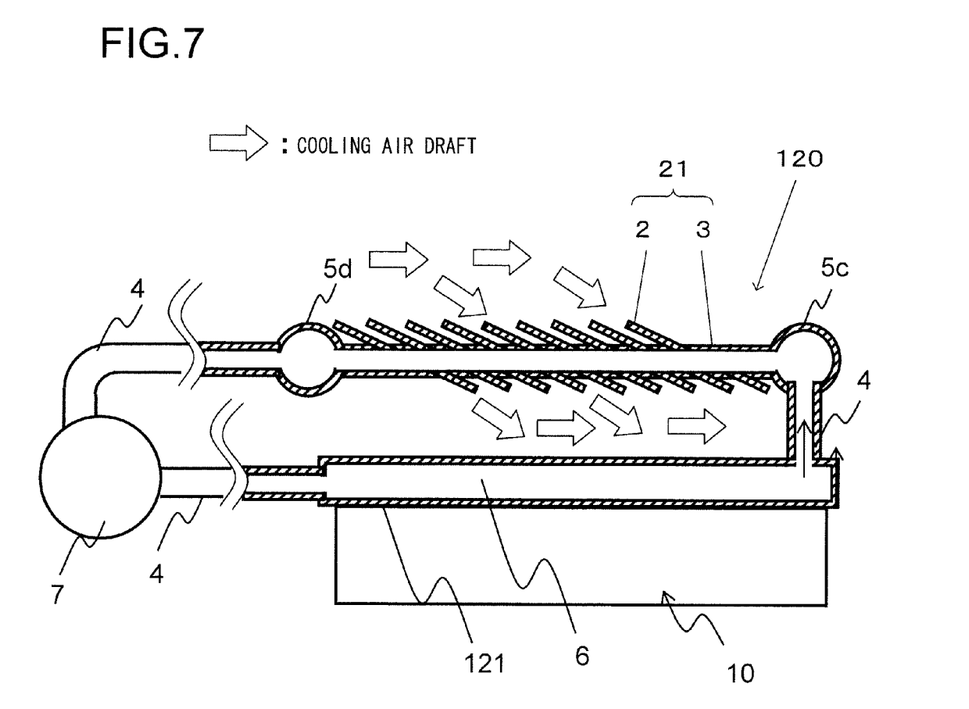
FIG. 7 is a figure showing a cooling system 120 according to a second embodiment of the present invention that operates according to a method of forced coolant circulation.

Since, in this embodiment, the method is employed of forcibly circulating the coolant with the pump 7, it is not necessary for the heat transfer conduits 3 to be provided as sloping, so that they can be arranged to be almost parallel to the coolant tank 121. Due to this, the flow of coolant within the heat transfer conduits 3 and the flow of the cooling air draft are opposite in direction, so that it is possible to anticipate enhancement of the heat exchange ratio. Moreover, the heat dissipation fins 2 are fixed slantingly to the heat transfer conduits 3. Due to this, it is arranged for the cooling air draft from the front of the vehicle (i.e. from the left side in the figure) to be bent through a certain angle as it passes the heat dissipation fins 2 and to pass between the heat transfer conduits 3 from above to below, so that the heat dissipation from the heat dissipation fins 2 increases.

With this cooling system that cools the onboard electrical power converter 10 in which it is arranged for the heat dissipation surface to extend almost parallel to the flow of the cooling air draft as described above, along with the heat exchanger 21 being arranged almost parallel to the flow of the cooling air draft, also it is arranged for the cooling air draft to pass through the heat exchanger 21 past the heat dissipation fins 2. Due to this, along with it being possible to ensure high cooling performance, also it is possible to reduce the dimension of this cooling system in the height direction. As a result, it becomes possible to house this cooling system simply and easily within a vehicle front machinery compartment where the space for arranging equipment is limited.

Embodiment #3

Figure 8:
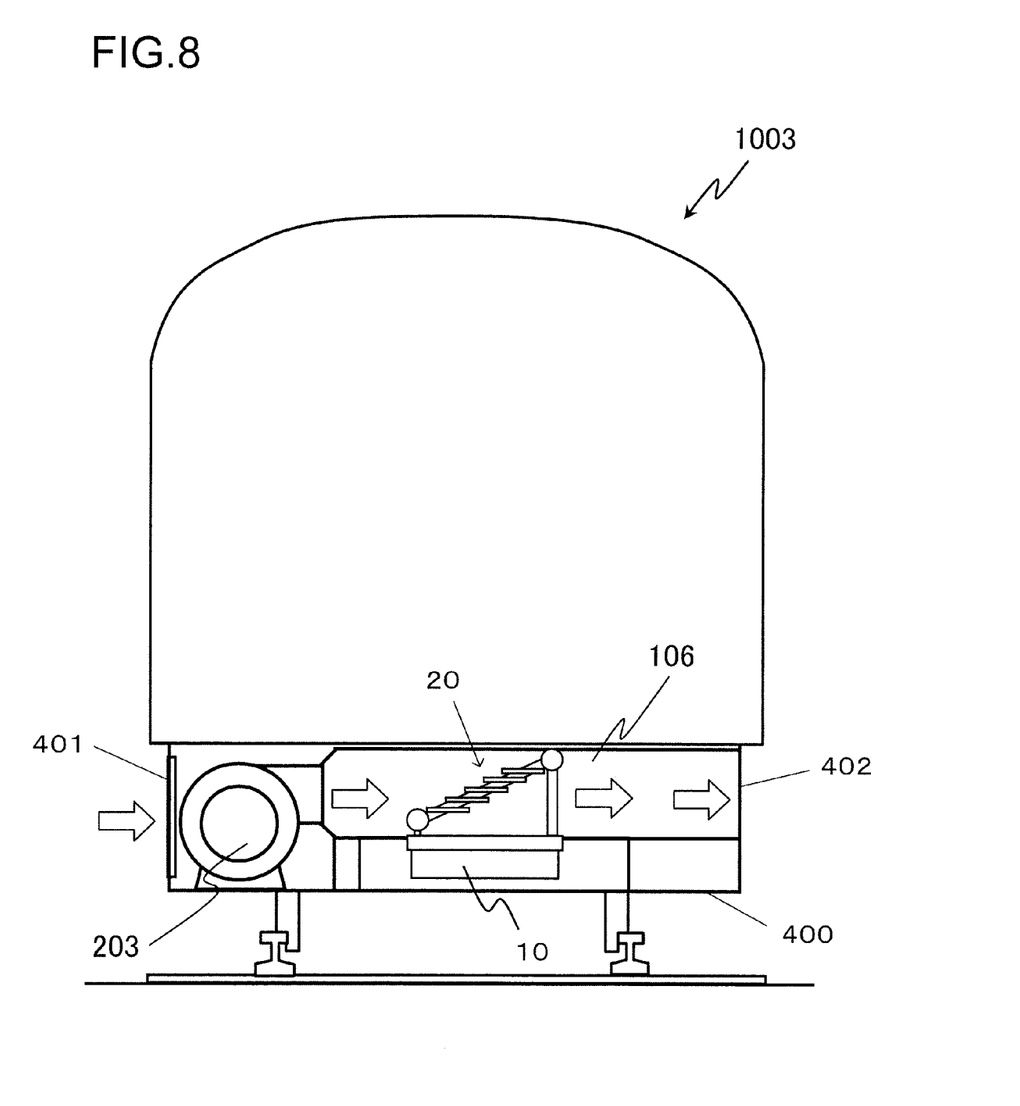
FIG. 8 is a figure showing a third embodiment of the cooling system of the present invention.

FIG. 8 is a figure showing a third embodiment of the cooling system of the present invention, in which the present invention is applied to cooling an electrical power converter that is mounted to a railway vehicle. In order to enlarge the space in the passenger cabin of a railway vehicle so as to increase the number of passengers who can ride therein, the electrical power converter that drives an electrical railway vehicle (hereinafter termed an "electric train carriage") is often installed underneath the floor of the passenger cabin. Due to this, the dimension in the height direction of the space in which this electrical power converter can be mounted is limited.

FIG. 8 is a schematic cross sectional figure of an electric train carriage as seen from its direction of travel. A casing 400 in which an electrical power converter is housed is fitted under the floor of the body 1003 of this electric train carriage. An inlet aperture 401 is provided at one side of this casing 400, and an exhaust aperture 402 is provided at its other side. An air duct 106 is provided in the casing 400, and an air blower 203 is fitted at one opening of this air duct 106, with its other opening being communicated with the exhaust aperture 402. The air blower 203 is provided so as to suck in a draft of cooling air from the air supply aperture 401, and this cooling air draft is discharged from the exhaust aperture 402 after having passed through the air duct 106.

An electrical power converter 10 is arranged below the lower portion of the air duct 106 and external thereto, and a cooling system 20 is provided above the electrical power converter 10 so as to be positioned within the air duct 106. The cooling system 20 of this embodiment is a cooling system to which the evaporative cooling method is applied, and has the same structure as the cooling system 20 shown in FIG. 3. Since in the case of an electric train carriage the AC power that is supplied is first converted into DC power by a converter and then is converted by an inverter back into AC power, this electrical power converter includes both a converter unit and an inverter unit.

In this embodiment as well, it is possible to reduce the dimension of the cooling system 20 in the height direction, while also being able to anticipate enhancement of the performance of the cooling system 20 by enhancement of the heat exchange ratio of the heat exchanger. Due to this, it is possible to keep small the height dimension of the casing 400 that is provided under the floor of the body 1003 of this electric train carriage.

Figure 9:
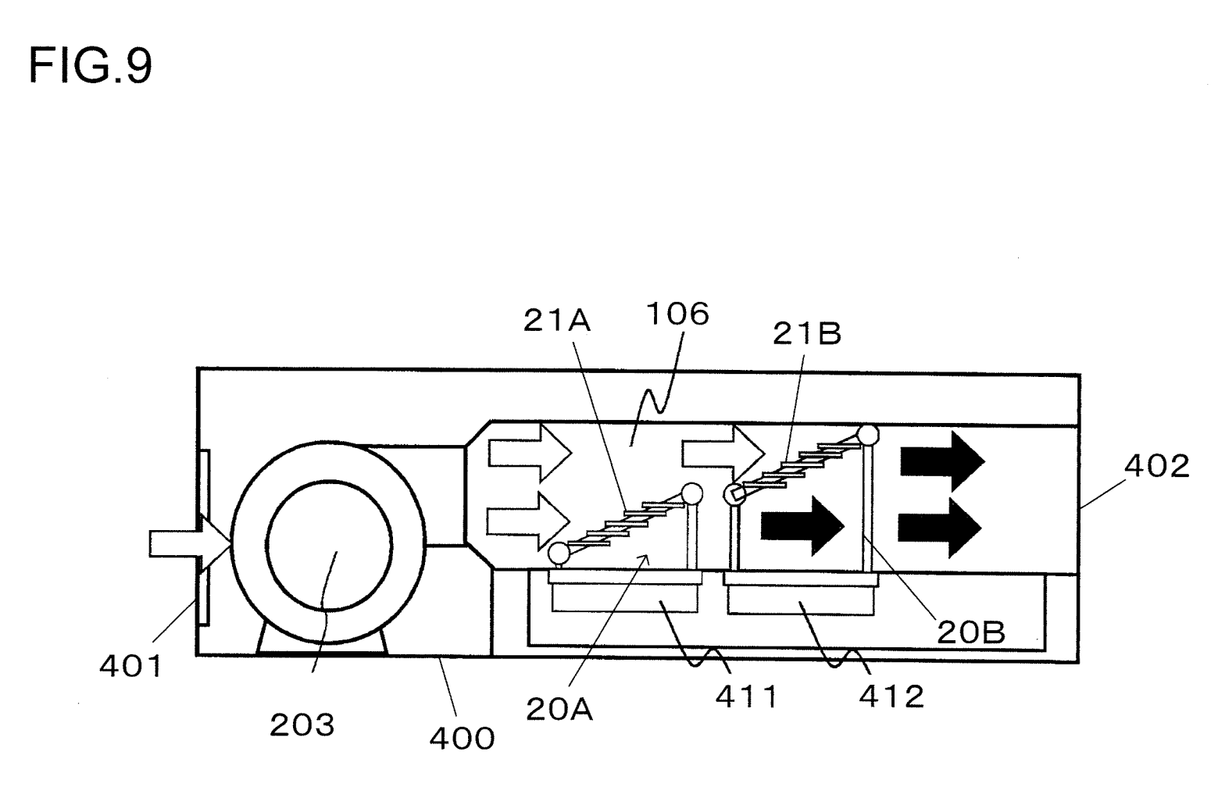
FIG. 9 is a figure showing a first variant embodiment of the third embodiment.

FIG. 9 is a figure showing a first variant embodiment of this embodiment. In this first variant embodiment, it is arranged for each of the converter unit and the inverter unit to be cooled by its own separate cooling system. The converter unit 411 and the inverter unit 412 are provided outside and underneath the lower portion of the air duct 106, and are lined up one after the other, i.e. in the left to right direction in the figure, which is the direction along which the flow of the cooling air draft passes. A cooling system 20A that cools the converter unit 411 (i.e. the heat-evolving unit that is located at upstream) has the same structure as the cooling system 20 shown in FIG. 3. On the other hand, in a cooling system 20B that cools the inverter unit 412 (i.e. the heat-evolving unit that is located at downstream), it is arranged for the lengths of the conduits 4a and 4b to be greater than the lengths of the corresponding conduits of the cooling system 20A, so that the heat exchanger 21B is located higher up than the heat exchanger 21A.

Due to this, the cooling air draft that flows along the lower side of the air duct 106 flows into the heat exchanger 21A of the cooling system 20A that is located at more upstream, while the cooling air draft that flows along the upper side of the air duct 106 flows into the heat exchanger 21B of the cooling system 20B that is located at more downstream. After having passed through the heat exchangers 21A and 21B, these cooling air drafts are then discharged from the exhaust aperture 402.

In this embodiment, the heat exchangers 21A and 21B are spaced apart in the vertical direction with respect to the air flow, so that they are not superimposed in the flow direction. As a result, even though the two cooling systems 20A and 20B are disposed along the flow of the cooling air draft, it is possible to ensure that the draft of cooling air that has been sucked in from the external atmosphere can flow directly into both of their heat exchangers. Furthermore, as explained in connection with the first embodiment as well, by arranging the heat exchangers 21A and 21B along the direction of flow of the cooling air draft, it is possible to reduce the height of the cooling systems, and thus it is possible to reduce the height dimension of the air duct 106.

It should be understood that while, in the example shown in FIG. 9, it is the heat exchanger 21B of the downstream cooling system 20B that is displaced upwards as compared to the heat exchanger 21A, it is actually not important which one of the heat exchangers 21A and 21B is raised up. Furthermore, while in FIG. 9 an example has been shown of a case in which two cooling systems are used in sequence, it would also be possible to apply the present invention to the case of three or more cooling systems in a similar manner, for example if, in addition to the converter and the inverter of the traction motor, a further inverter for an air conditioning system were also to be provided in a parallel configuration, or the like.

Figure 10:
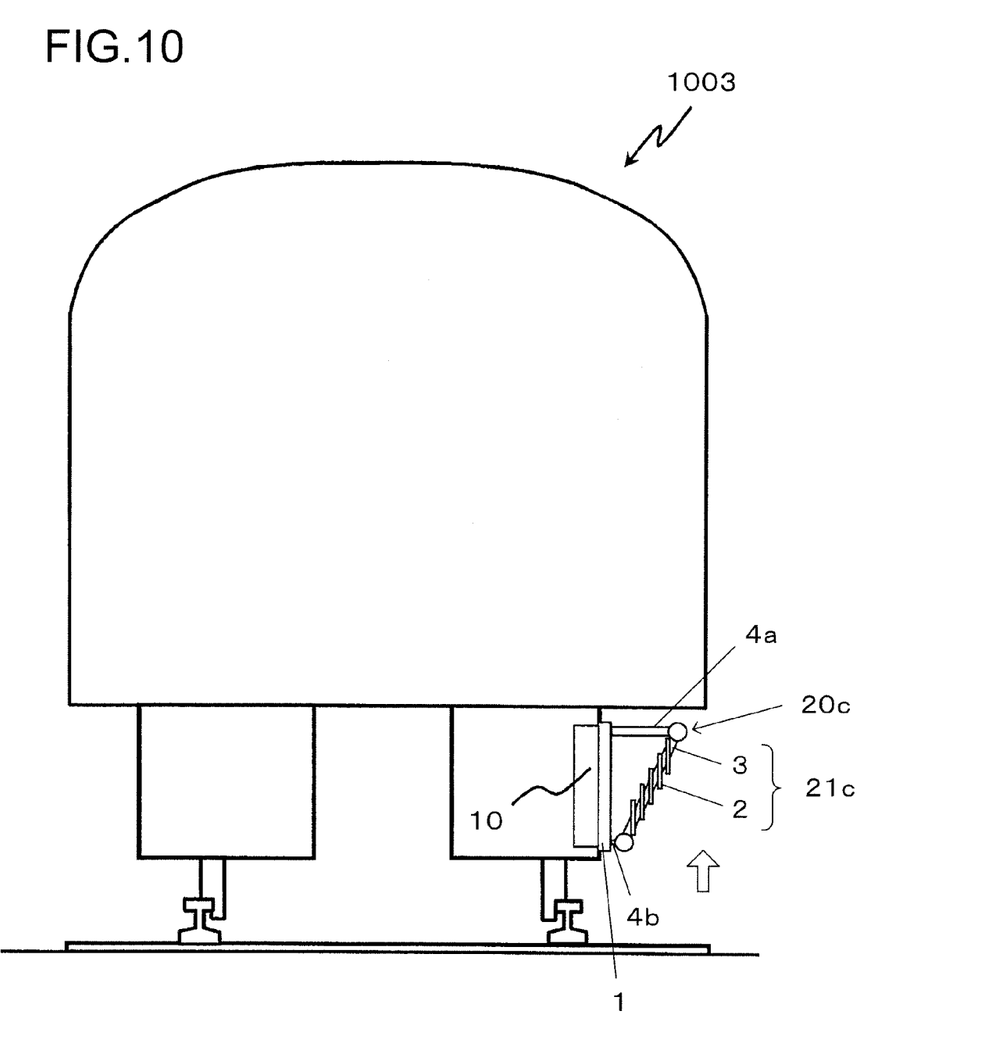
FIG. 10 is a figure showing a second variant embodiment of the third embodiment.

FIG. 10 is a figure showing a second variant embodiment of the cooling system of the present invention that is used in an electric train carriage. FIG. 10 is a schematic cross sectional figure showing an electric train carriage as seen from its direction of travel, and here a cooling system 20C has the same structure as the cooling system 20 of FIG. 3. However, the attitude in which it is mounted is different from the attitude in the FIG. 3 case. A heat dissipation surface of an electrical power converter 10 that is provided beneath the carriage floor (corresponding to the surface of the heat dissipation base 14 shown in FIG. 3) is provided vertically with respect to the floor, and the evaporation chamber 1 of the cooling system 20C is also provided vertically. And it is arranged for the lengths of the heat transfer conduits 3 that connect to the evaporation chamber 1 to be shorter at the lower side in the figure and longer at the upper side in the figure.

In this second variant embodiment, although during vehicle motion the relative wind is employed as the cooling air draft, it is arranged for cooling to be provided by air flow due to natural convection while the vehicle is stopped. Since the flow of the relative wind is in a direction that is perpendicular to the direction in which the heat transfer conduits 3 extend, a similar heat exchange ratio is obtained, at whatever positions the heat transfer conduits may be located. On the other hand, since while the vehicle is stopped the flow of air is from below to above as shown in the figure, the same relationship with the cooling air draft holds as in the case explained with reference to FIG. 3, and it is possible to obtain similar beneficial effects. In particular since, with the method of this second variant embodiment, it is possible to obtain a beneficial effect with regard to cooling even while the vehicle is at rest, accordingly it is effective for coping with generation of heat even when this electric train carriage is at rest, for example with generation of heat from an electrical power converter for an air conditioning system, as well as when the carriage is moving.

Since the heat exchanger 21C is provided to the cooling system 20C so as to be angled with respect thereto, it is possible to reduce the dimension of the cooling system 20C in the left to right direction in the figure. In the case of a railway vehicle, it is necessary for this to be a dimension that does not exceed a certain vehicle limiting sectional profile. And, according to this second variant embodiment, it becomes possible for the external shape of the cooling system to conform to this vehicle limiting sectional profile, since, along with it being possible to reduce the height of the heat exchanger 21C, also this angled construction is employed in which the lower end in the figure of the heat exchanger 21C is somewhat squeezed inwards.

(C1) As described above, as shown in FIG. 3, one embodiment of the present invention is a cooling system 20 for an onboard electrical power converter 10 in which a heat dissipation surface of a heat dissipation base 14 extends substantially parallel to a flow of cooling air, including: an evaporation chamber 1 that serves as a coolant tank that contains coolant 6, and a bottom surface of which is in thermal contact with a heat dissipation surface of the onboard electrical power converter 10; a vapor pipe 4a that is provided connecting to an upper surface of the evaporation chamber 1 and downstream of the flow of cooling air, out into which the coolant flows from the evaporation chamber 1; a heat exchanger 21 that opposes the upper surface of the evaporation chamber 1 and comprises a plurality of heat transfer conduits 3 arranged so as to extend along the upper surface from downstream of the cooling air draft to upstream thereof, and that conducts coolant in the vapor pipe 4a to upstream of the flow of cooling air via the plurality of heat transfer conduits 3; and a liquid return pipe 4b that serves as a return means that returns coolant from the heat exchanger 21 to the evaporation chamber 1. And the heat exchanger 21 is provided on the outer surrounding surfaces of the heat transfer conduits 3, and includes a plurality of heat dissipation fins 2 past which the cooling air draft passes from the side of the heat exchanger 21 that does not face the evaporation chamber 1 to its side that faces the evaporation chamber 1.

The heat exchanger 21 that incorporates the heat dissipation fins 2 and the heat transfer conduits 3 has a structure as described above. As a result, even though the heat dissipation surface of the onboard electrical power converter 10 is arranged so as to be approximately parallel to the flow of the draft of cooling air, it is possible for the area on the heat exchanger 21 through which the cooling air draft flows and passes through to be made of the same approximate order as the area of the evaporation chamber 1. Accordingly it is possible to reduce the dimension in the height direction of the cooling system 20, including the heat exchanger 21, while still maintaining a high performance for the heat exchanger 21.

(C2) The heat exchanger 21 may be tilted by making the liquid return pipes 4b to be shorter than the vapor pipes 4a, so that the inclination of the plurality of heat dissipation fins 2 is set to be approximately parallel to the flow of the draft of cooling air. As a result, it is possible to reduce the resistance of the heat dissipation fins 2, so that it is possible to increase the amount of cooling air flow.

(C3) As shown in FIG. 9, the electrical power converter for a railway vehicle according to one embodiment of the present invention includes: an air blower device 203 that blows a draft of cooling air, provided underneath a floor of the railway vehicle; a cooling unit 20, including two cooling systems 20A and 20B as shown in FIG. 3 disposed along the flow of the draft of cooling air; a converter unit 411 that is cooled by the cooling system 20A of this cooling unit, and that converts supplied AC power into DC power; and an inverter unit 412 that is cooled by the cooling system 20B of the cooling unit, and that converts the DC power outputted from the converter unit 411 into AC power that is then supplied to a traction motor. And the heat exchangers 21A and 21B of the two cooling systems are arranged so as to be mutually staggered apart in the direction perpendicular to the flow of the draft of cooling air, so that the cooling air draft that has passed through the heat exchanger 21A of the cooling system 20A that is disposed at the upstream side of the cooling unit does not flow into the heat exchanger 21B of the cooling system 20B that is disposed at the downstream side of the cooling unit.

The heat exchanger 20B is staggered with respect to the heat exchanger 20A in the direction perpendicular to the flow of the draft of cooling air. Since, due to this, it is possible to present the cooling air draft that has passed through the heat exchanger 20A and has been heated up thereby from flowing into the heat exchanger 20B, and since some of the cooling air draft from the air blower 203 flows directly into the heat exchanger 20B, accordingly, with the heat exchanger 20B that is relatively downstream, it is possible to attain a similar heat exchange ratio to that attained with the heat exchanger 20A that is relatively upstream.

(C4) Moreover, the electrical power converter for a railway vehicle shown in FIG. 8 includes: an electrical power converter 10 that is an electrical conversion unit that is provided underneath a floor of the railroad vehicle 1003, and that, after having temporarily converted supplied AC power into DC power, re-converts this DC power back into AC power that is then supplied to a traction motor; a cooling system 20 according to the first embodiment, attached to a heat dissipation surface of the electrical power converter 10; and an air blower device 203 that blows a draft of cooling air against the heat exchanger of the cooling system 20. In the cooling system 20, the heat exchanger is provided so as to be tilted along the flow of the draft of cooling air, and so that the angle of the heat dissipation fins is approximately parallel to the flow of the draft of cooling air. As a result the height dimension of the cooling system 20 can be reduced, while still being able to anticipate enhancement of the performance of the cooling system 20 by enhancing the heat exchange ratio of the heat exchanger. Due to this, it is possible to restrict the height dimension of the casing 400 that is provided underneath the floor of the body 1003 of the electric train carriage.

(C5) Moreover, if the electrical power converter 10 is provided underneath the floor of the railway vehicle 1003 as shown in FIG. 10 so that a heat dissipation surface thereof is substantially vertical, then the cooling system 20C may be arranged so that the conduits 4b are lower in the vertical direction than the conduits 4a. Due to this, it is possible to reduce the dimension of the cooling system 20C in the left to right direction as seen in the figure. Thus, the problem of a portion of the cooling system 20C projecting out from the limiting sectional profile for the vehicle can be prevented.

(C6) Furthermore, as shown in FIG. 7, a circulation pump 7 may be provided for circulating coolant between a coolant tank 121 and a heat exchanger 120. Due to this, it is possible to reduce the angle of tilting of the heat exchanger 120, and it is also possible to set this tilting angle to zero. In this way, it is possible to reduce the height dimension of the cooling system.

The above described embodiments are examples, and various modifications can be made without departing from the scope of the invention.

What is claimed is:

1. A cooling system for an onboard electrical power converter in which a heat dissipation surface extends substantially parallel to a flow of cooling air draft, comprising:
   a coolant tank that contains coolant, and includes a bottom surface and an upper surface, the bottom surface being in thermal contact with the heat dissipation surface of the onboard electrical power converter;
   a first conduit that is provided connecting to the upper surface of the coolant tank and at downstream of the flow of the cooling air draft, the coolant flowing from the coolant tank out into the first conduit;
   a heat exchanger that comprises a plurality of second conduits arranged with opposing the upper surface of the coolant tank so as to extend along the upper surface from downstream of the flow of the cooling air draft to upstream thereof, and that conducts the coolant in the first conduit to upstream of the flow of the cooling air draft via the plurality of second conduits; and
   a return unit that returns the coolant from the heat exchanger to the coolant tank; wherein
   the heat exchanger comprises a plurality of heat dissipation fins through which the cooling air draft passes from a first side of the heat exchanger to a second side of the heat exchanger, the heat dissipation fins being provided on outer surfaces of the second conduits, the first side not facing the coolant tank and the second side facing the coolant tank, wherein
   the cooling system is one that employs an evaporative cooling method in which the coolant within the coolant tank is boiled and evaporated by heat from the electrical power converter;
   the return unit is configured to a third conduit that is shorter than the first conduit;
   the third conduit is provided to the upper surface of the coolant tank at the upstream of the flow of the cooling air draft, and returns the coolant in the plurality of second conduits to the coolant tank;
   the inclination of the plurality of the heat dissipation fins is set to be approximately parallel to the flow of the cooling air draft;
   the onboard electrical power converter is provided underneath a floor of a railway vehicle, so that the heat dissipation surface thereof is substantially vertical; and
   the third conduit is arranged to be lower in the vertical direction than the first conduit.

2. A cooling system for an onboard electrical power converter in which a heat dissipation surface extends substantially parallel to a flow of cooling air draft, comprising:
   a coolant tank that contains coolant, and includes a bottom surface and an upper surface, the bottom surface being in thermal contact with the heat dissipation surface of the onboard electrical power converter;
   a first conduit that is provided connecting to the upper surface of the coolant tank and at downstream of the flow of the cooling air draft, the coolant flowing from the coolant tank out into the first conduit;
   a heat exchanger that comprises a plurality of second conduits arranged with opposing the upper surface of the coolant tank so as to extend along the upper surface from downstream of the flow of the cooling air draft to upstream thereof, and that conducts the coolant in the first conduit to upstream of the flow of the cooling air draft via the plurality of second conduits; and
   a return unit that returns the coolant from the heat exchanger to the coolant tank; wherein
   the heat exchanger comprises a plurality of heat dissipation fins through which the cooling air draft passes from a first side of the heat exchanger to a second side of the heat exchanger, the heat dissipation fins being provided on outer surfaces of the second conduits, the first side not facing the coolant tank and the second side facing the coolant tank;
   the cooling system is one that employs an evaporative cooling method in which the coolant within the coolant tank is boiled and evaporated by heat from the electrical power converter;
   the return unit is configured to a third conduit that is shorter than the first conduit;
   the third conduit is provided to the upper surface of the coolant tank at the upstream of the flow of the cooling air draft, and returns the coolant in the plurality of second conduits to the coolant tank;
   the inclination of the plurality of the heat dissipation fins is set to be approximately parallel to the flow of the cooling air draft;
   cutaways are formed in each of the plurality of the heat dissipation fins on a downstream side of the heat dissipation fins;
   the onboard electrical power converter is provided underneath a floor of a railway vehicle, so that the heat dissipation surface thereof is substantially vertical; and
   the third conduit is arranged to be lower in the vertical direction than the first conduit.

* * * * *